United States Patent
Mueller et al.

(10) Patent No.: US 12,082,456 B2
(45) Date of Patent: Sep. 3, 2024

(54) DISPLAY DEVICE FOR DISPLAYING A PIXEL-BASED GRAPHICAL CONTENT IN TWO DIRECTIONS AND MOTOR VEHICLE COMPRISING SUCH A DISPLAY DEVICE

(71) Applicant: AUDI AG, Ingolstadt (DE)

(72) Inventors: Ulrich Mueller, Ingolstadt (DE); Jacques Helot, Ingolstadt (DE); Seung Mo Kang, Seoul (KR); Sung Jun Park, Seoul (KR); Jiwon Oh, Seoul (KR)

(73) Assignee: AUDI AG, Ingolstadt (DE)

( * ) Notice: Subject to any disclaimer, the term of this patent is extended or adjusted under 35 U.S.C. 154(b) by 399 days.

(21) Appl. No.: 17/415,919

(22) PCT Filed: Dec. 10, 2019

(86) PCT No.: PCT/EP2019/084354
§ 371 (c)(1),
(2) Date: Jun. 18, 2021

(87) PCT Pub. No.: WO2020/126650
PCT Pub. Date: Jun. 25, 2020

(65) Prior Publication Data
US 2022/0085129 A1    Mar. 17, 2022

(30) Foreign Application Priority Data
Dec. 19, 2018    (EP) ..................... 18214024

(51) Int. Cl.
*H10K 59/128* (2023.01)
*B60R 1/04* (2006.01)
(Continued)

(52) U.S. Cl.
CPC ............. *H10K 59/128* (2023.02); *B60R 1/04* (2013.01); *B60R 1/12* (2013.01);
(Continued)

(58) Field of Classification Search
CPC .... H10K 59/128; H10K 59/50; H10K 59/176; H10K 2102/3031; B60R 1/04;
(Continued)

(56) References Cited

U.S. PATENT DOCUMENTS

2002/0003571 A1*    1/2002    Schofield .................. B60R 1/00
                                                                 348/148
2004/0145457 A1     7/2004    Schofield et al.
(Continued)

FOREIGN PATENT DOCUMENTS

CN    106627372 A    5/2017
DE    102006034954 A1    1/2008
(Continued)

OTHER PUBLICATIONS

Extended European Search Report dated Apr. 17, 2019 in corresponding European Patent Application No. 18214024.4 (7 pages).
(Continued)

*Primary Examiner* — Donald L Raleigh
(74) *Attorney, Agent, or Firm* — STAAS & HALSEY LLP

(57) ABSTRACT

A display device includes a pixel matrix configured to emit light, a first display screen which faces in a first direction, a second display screen which faces in a second direction, and a controller. The controller is configured to control the pixel matrix to emit light which passes through the first display screen and passes into surroundings of the display device in the first direction so that graphical content is displayed on the first display screen, based on image data that define the graphical content. The controller is also configured to operate in a first display mode in which graphical content as defined by image data is only displayed on the first display screen and the second display screen is deactivated, and a second display mode in which identical graphical content is
(Continued)

displayed on both the first display screen and the second display screen.

14 Claims, 3 Drawing Sheets

(51) Int. Cl.
    *B60R 1/12*       (2006.01)
    *G02F 1/1333*    (2006.01)
    *H10K 59/50*     (2023.01)

(52) U.S. Cl.
    CPC ....... *G02F 1/133342* (2021.01); *H10K 59/50* (2023.02); *B60R 2001/1215* (2013.01); *B60R 2001/1253* (2013.01); *B60R 2300/207* (2013.01)

(58) Field of Classification Search
    CPC .... B60R 2001/1215; B60R 2001/1253; B60R 2300/207; B60R 2300/8066; B60R 1/00; G02F 1/133342; G02F 2201/44
    See application file for complete search history.

(56) References Cited

U.S. PATENT DOCUMENTS

| | | | |
|---|---|---|---|
| 2012/0140304 A1* | 6/2012 | Kuhlman | G02F 1/1347 359/228 |
| 2012/0176570 A1 | 7/2012 | Yamazaki | |
| 2016/0159286 A1* | 6/2016 | Harville | B60R 1/12 348/148 |
| 2016/0179452 A1* | 6/2016 | Huang | G09G 3/36 345/3.1 |
| 2016/0375833 A1 | 12/2016 | Larson | |
| 2018/0046011 A1 | 2/2018 | Tang | |
| 2018/0301117 A1 | 10/2018 | Mourou | |
| 2018/0336851 A1* | 11/2018 | Hidaka | G06F 1/1652 |

FOREIGN PATENT DOCUMENTS

| | | |
|---|---|---|
| DE | 102011112807 A1 | 3/2013 |
| DE | 102015200233 A1 | 7/2016 |
| EP | 18214024.4 | 12/2018 |
| TW | M562242 U | 6/2018 |
| WO | PCT/EP2019/084354 | 12/2019 |

OTHER PUBLICATIONS

International Search Report (Forms PCT/ISA/210, PCT/ISA/220); mailed Jan. 15, 2020 in corresponding PCT Application No. PCT/EP2019/084354 (13 pages).

Written Opinion (Form PCT/ISA/237); mailed Jan. 15, 2020 in corresponding PCT Application No. PCT/EP2019/084354 (5 pages).

International Preliminary Report on Patentability (Form PCT/IB/373); mailed Jun. 16, 2021 in corresponding PCT Application No. PCT/EP2019/084354 (1 page).

Chinese Office Action dated Nov. 1, 2023 for Chinese Application No. 201980083611.8.

* cited by examiner

DISPLAY DEVICE FOR DISPLAYING A PIXEL-BASED GRAPHICAL CONTENT IN TWO DIRECTIONS AND MOTOR VEHICLE COMPRISING SUCH A DISPLAY DEVICE

CROSS-REFERENCE TO RELATED APPLICATIONS

This application is a U.S. national stage of International Application No. PCT/EP2019/084354, filed on Dec. 10, 2019. The International Application claims the priority benefit of European Patent Application No. 18214024.4 filed on Dec. 19, 2018. Both International Application No. PCT/EP2019/084354 and European Patent Application No. 18214024.4 are incorporated by reference herein in their entirety.

BACKGROUND

Described herein is a display device or electronic visual display for displaying a pixel-based graphical content. The graphical content may be defined by, e. g., the image data of a camera. Also described herein is a motor vehicle that is equipped with the display device described herein.

For displaying a pixel-based graphical content, a display device may include a pixel matrix which is an arrangement of individually controllable pixel elements that may emit light in the color and/or brightness as is needed for displaying the corresponding pixel value of the graphical content. The pixel values may be defined by image data that, as a whole, define the present graphical content. One example of such a pixel matrix is a LCD (liquid crystal display). The pixel matrix may be controlled by a control unit. For letting the light of the pixel matrix pass into the surrounding of the display device, the display device may provide a display screen, i.e. a transparent pane or sheet. The light emitted by the pixel matrix is emitted through the display screen in such a way that the light travels along a viewing direction from which a user may see the light on the display screen.

In some situations, there is an interest to display graphical content not only in one direction, but in two different directions, particularly in two opposing directions.

For example, German Patent Application No. 10 2015 200 233 A1 describes a display device with a display screen that may be turned around an axis for displaying a graphical content either towards an interior of a vehicle or through a wind screen towards the outside of the vehicle. However, this solution only allows displaying the graphical content in one direction at a time.

German Patent Application No. 10 2011 112 807 A1 describes a rear mirror of a vehicle that also includes an integrated LCD (Liquid Crystal Display) for displaying an image of a parking meter towards the front of the vehicle. The mirror itself is a classical mirror that reflects light coming from the rear of the car. Thus, pixel-based graphical content may only be displayed in one direction towards the front of the vehicle.

German Patent Application No. 10 2006 034 954 A1 describes a vehicle including external display devices that may display the current travelling speed of the vehicle in such a way that the displayed value of the travel speed may be seen from outside the vehicle. However, for displaying the value of the travelling speed in several different directions, several independent display screens are needed.

SUMMARY

Aspects of the disclosure described herein are directed to displaying a pixel-based graphical content in two different directions without the need of providing two independent display devices.

This may be accomplished by the display device and motor vehicle described herein. Advantageous developments with convenient and non-trivial further embodiments are also described herein.

Described herein is a display device for displaying a pixel-based graphical content. A control unit (controller) is designed to control a pixel matrix for emitting light that shows the graphical content. A pixel matrix can be based on known technology, e.g. a pixel matrix based on an OLED (Organic Light Emitting Diode) or LCD (Liquid Crystal Device). The control of the pixel matrix as performed by the control unit is performed as a function of image data that define the present graphical content. Such image data can describe the graphical content for example on the basis of RGB-values (RGB-Red Green Blue) and/or in the format JPEG (Joint Photographic Expert Group) or MPEG (Moving Picture Expert Group).

A first display screen is provided through which the light passes into the surroundings of the display device in a first direction. Thus the graphical content may be seen from a point of view situated or positioned along the first direction. The first display screen is designed to present the graphical content in a first direction. The display screen can be based on glass or a transparent polymer.

For displaying the graphical content in a second direction, the display device includes a second display screen which faces into a different direction compared to the first display screen. In general, the direction of a display screen can be defined by a normal vector, i.e. a vector that is arranged perpendicular with regard to the surface of the display screen. The normal vector of the surface of the second display screen, especially the normal vector at the center of the surface of the second display screen, and the normal vector of the surface of the first display screen, especially the normal vector at the center of the surface of the first display screen, are arranged at an angle greater than 90 degrees. Thus, either one of the two display screens may be seen when the display device is regarded from two opposite directions. The second display screen, for example, faces into an opposite direction as compared to the first display screen.

The control unit includes at least two display modes wherein, in a first one of the display modes (i.e. a first display mode), the graphical content as represented by the image data is only displayed on either one of the display screens and the respective other display screen is deactivated, i.e. no light is emitted through the deactivated display screen. In a second one of the display modes (i.e. a second display mode), the same graphical content is displayed on both the first and the second display screen. The effect of the two display modes is that the control unit can be designed simply so that only one graphical content at a time is presented although two display screens are available. In other words, no two independent graphic control units are needed for displaying different graphical contents on the two display screens at the same time.

Another advantage may include that the display device may be built with a control unit that is only designed to use the image data for one graphical content at a time. This saves the memory for storing additional image data for a second graphical content and it saves the processing power that would be needed for presenting the additional image data or the additional graphical content on the second display screen.

Also described herein are embodiments that provide features which afford additional technical advantages.

In one embodiment, the light that is emitted through the first display screen and through the second display screen is generated or emitted from the same pixel matrix. In other words, for emitting light that shows the graphical content on the second display screen, the same pixel matrix is provided that also emits light through the first display screen. A corresponding pixel matrix can be based for example on an OLED, as an OLED is able to emit light in two opposite directions. As a consequence, the graphical content as shown on the second display screen is a mirrored version with regard to the same graphical content as shown on the first display screen. For example, the first display screen and the second display screen face into two opposite directions. Then, the pixel matrix can be seen through both display screens from a perpendicular viewing angle with regard to a surface plane of the pixel matrix. The embodiment provides the advantage that only one pixel matrix is necessary for displaying the graphical content on both display screens.

In one embodiment for deactivating one of the display screens in the described second display mode, a switchable layer is arranged between the pixel matrix and the respective display screen. This is the display screen that is deactivated in the first display mode. The control unit is designed to switch the switchable layer into a light-blocking mode for deactivating the display screen. In other words, the switchable layer is switchable between a light-blocking mode and a light-passing mode (transparent mode). In the light-passing mode, the light emitted by the pixel matrix may pass the switchable layer and pass through the display screen behind it. In the light-blocking mode, the light emitted by the pixel matrix is blocked or absorbed by the switchable layer. Thus, the display screen behind the switchable layer will not receive the light and thus on this display screen the graphical content is not visible or shown.

In one embodiment, the switchable layer is provided on the basis of a liquid crystal glass and/or an electrochromic element and/or a suspended particle device (SPD). This provides the advantage that the switchable layer may be provided with a thickness smaller than 1 cm. Another advantage is that the switchable layer may be controlled by an electric signal, e.g. an AC signal (AC—alternating current).

In one embodiment, a second switchable layer is provided between the pixel matrix and the other display screen, and the control device is designed to provide a third display mode which includes that the second switchable layer is switched into the light-blocking mode. In other words, by providing a second switchable layer, the other one of the display screens may be deactivated in the above described sense. The third display mode may include that both display screens are deactivated or that only the display screen is deactivated that is associated with the second switchable layer.

So far, embodiments have been described that are based on a single pixel matrix.

In one embodiment, in addition to the pixel matrix, a second pixel matrix is provided for emitting light through the second display screen. In other words, each display screen is associated or provided with its own pixel matrix. If a light-tight material is arranged between the two pixel matrixes, it is possible to deactivate one display screen by deactivating the pixel matrix itself (especially in the case of an OLED) and/or by deactivating the light source of the display screen (especially in the case of an LCD). If a common light source is arranged between the pixel matrices, only one light source is needed for providing the light that shall pass through both pixel matrixes (in the case of LCD-based pixel matrixes). In this case, for deactivating one of the display screen, a switchable layer may be provided as has been explained above.

In one embodiment, no display mode is provided that includes displaying different graphical content based on different image data on the two display screens at the same time. In other words, such a display mode is missing in the display device. As was already explained, this simplifies the technical construction of the control unit.

In one embodiment, the display device is designed as an electronic rear mirror for a motor vehicle. The control unit is designed to receive camera image data from a rear view camera of the motor vehicle as the image data at least when the control unit operates in the described first display mode, i.e. when only one of the display screens is activated. An electronic rear mirror is not based on the principle of light reflection as is a common mirror. Instead, an electronic rear mirror displays camera image data of a camera that is directed towards the rear direction behind a person that views the activated display screen of the electronic rear mirror.

Also described herein is a motor vehicle. The motor vehicle includes the display device described herein. The motor vehicle may include a passenger vehicle or a truck, for example.

The display device may be arranged for example in a passenger cabin of the motor vehicle. The display device may be arranged between a front seat and a back seat for displaying graphical content to both a passenger on the front seat and a passenger on the back seat.

However, in one embodiment, the display device is designed as an electronic rear mirror such that a first display screen of the display device is adjusted to face towards the passenger cabin of the motor vehicle, and a second display screen of the display device is adjusted to face towards a front window or is even constituted by the front window. In other words, the first display screen that is facing towards the passenger cabin may be used as the electronic rear mirror. The control unit of the display device may display or present camera image data of a rear view camera on this first display screen in the first display mode. In the second display mode, graphical content may be displayed both towards the passenger cabin (on the first display screen) and through the front window towards the front of the vehicle (second display screen). For example, in an autopilot mode, the graphical content may show a planned or future driving direction as is intended by the autopilot. By visualizing this driving direction to both a user in the passenger cabin and other viewers outside in front of the vehicle, the information about the next maneuver of the autopilot is available to them all.

BRIEF DESCRIPTION OF THE DRAWINGS

In the following, aspects and advantages will become more apparent and more readily appreciated from the following description of various examples, taken in conjunction with the accompanying drawings, of which.

DETAILED DESCRIPTION

Figure 1:
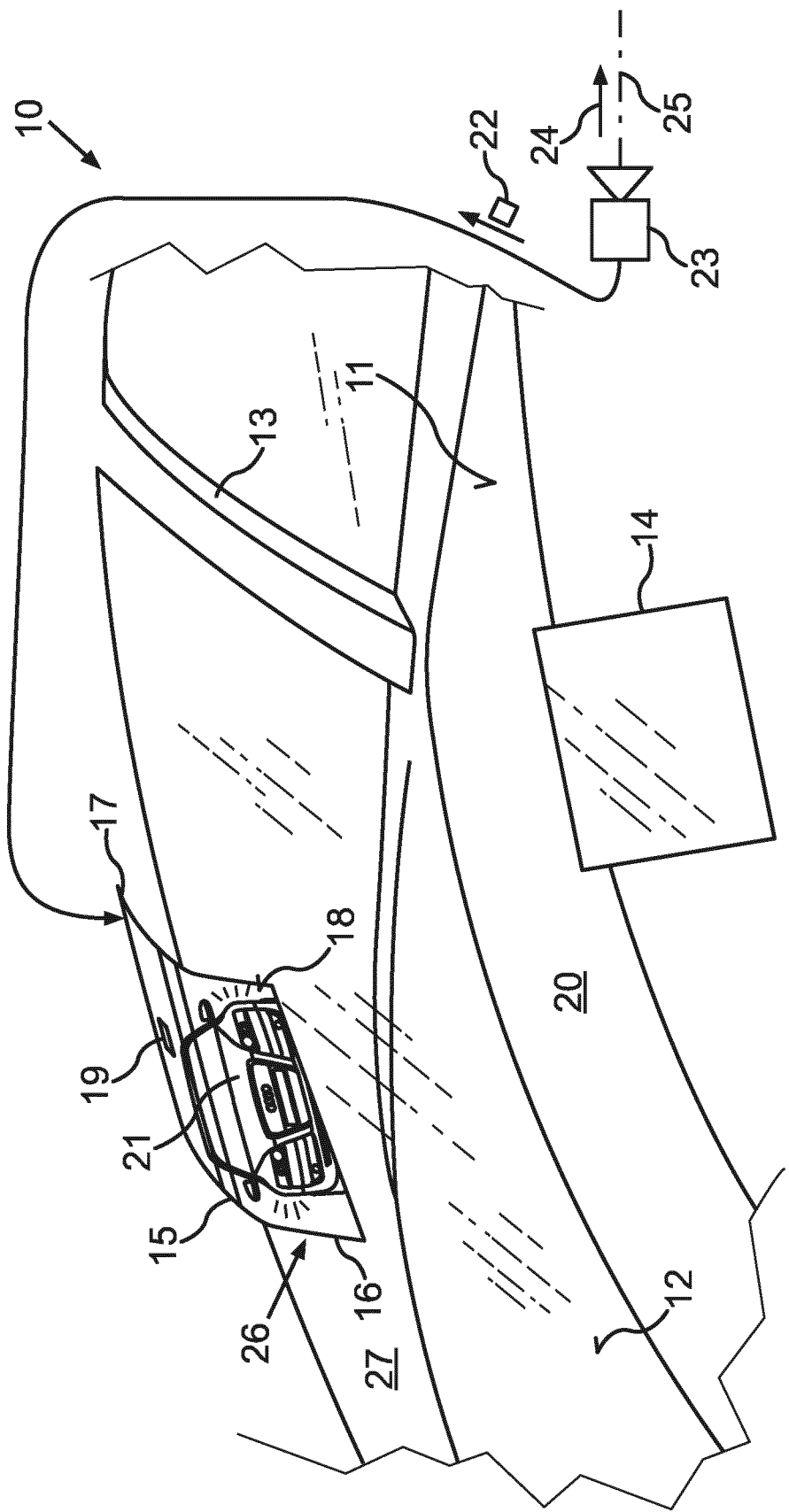
FIG. 1 is a schematic illustration of an embodiment of the motor vehicle described herein, according to examples of the disclosure.

The embodiments explained herein are example embodiments. However, in the embodiments, the described components of the embodiments each represent individual features of which are to be considered independently of each other and which each develop the disclosure also independently of each other and thereby are also to be regarded as a component in an individual manner or in another manner than the shown combination. Furthermore, the described embodiments can also be supplemented by further features already described.

In the drawings identical reference signs indicate elements that provide the same function.

FIG. 1 shows a perspective view of a motor vehicle 10, which may be a passenger vehicle or a truck, for example. The view illustrated in FIG. 1 may be the view as seen from a driver's seat. What is shown is a dashboard 11, a front window 12, an A-column 13 supporting a roof of the vehicle, an infotainment system 14, and a display device 15 which may be designed as an electronic rear view mirror 16. Through the front window 12, an engine bonnet or engine hood may be seen.

The display device 15 may include a control unit 17 and a first display screen 18. The control unit 17 may present or display image data 19 on the display screen 18. Display screen 18 may be facing towards a passenger cabin 20. Thus, a driver on a driver's seat may see the display screen 18 and may view pixel-based graphical content 21 as is defined by the image data 19. In the case that display device 15 is an electronic rear mirror 16, the image data 19 may be camera image data 22 which may be generated by or which may be received out of a rear view camera 23. The rear view camera 23 may be orientated towards a rear direction 24 with regard to vehicle 10. For example, an optical axis 25 of camera 23 may face towards a rearward half-space of vehicle 10.

In the vehicle 10, the display device 15 may also include a second display screen 26 which may face towards a front 27 of vehicle 10 such that if the graphical content 21 is displayed on the second display screen 26 the graphical content 21 may be seen from outside vehicle 10 through the front window 12.

Figure 2:
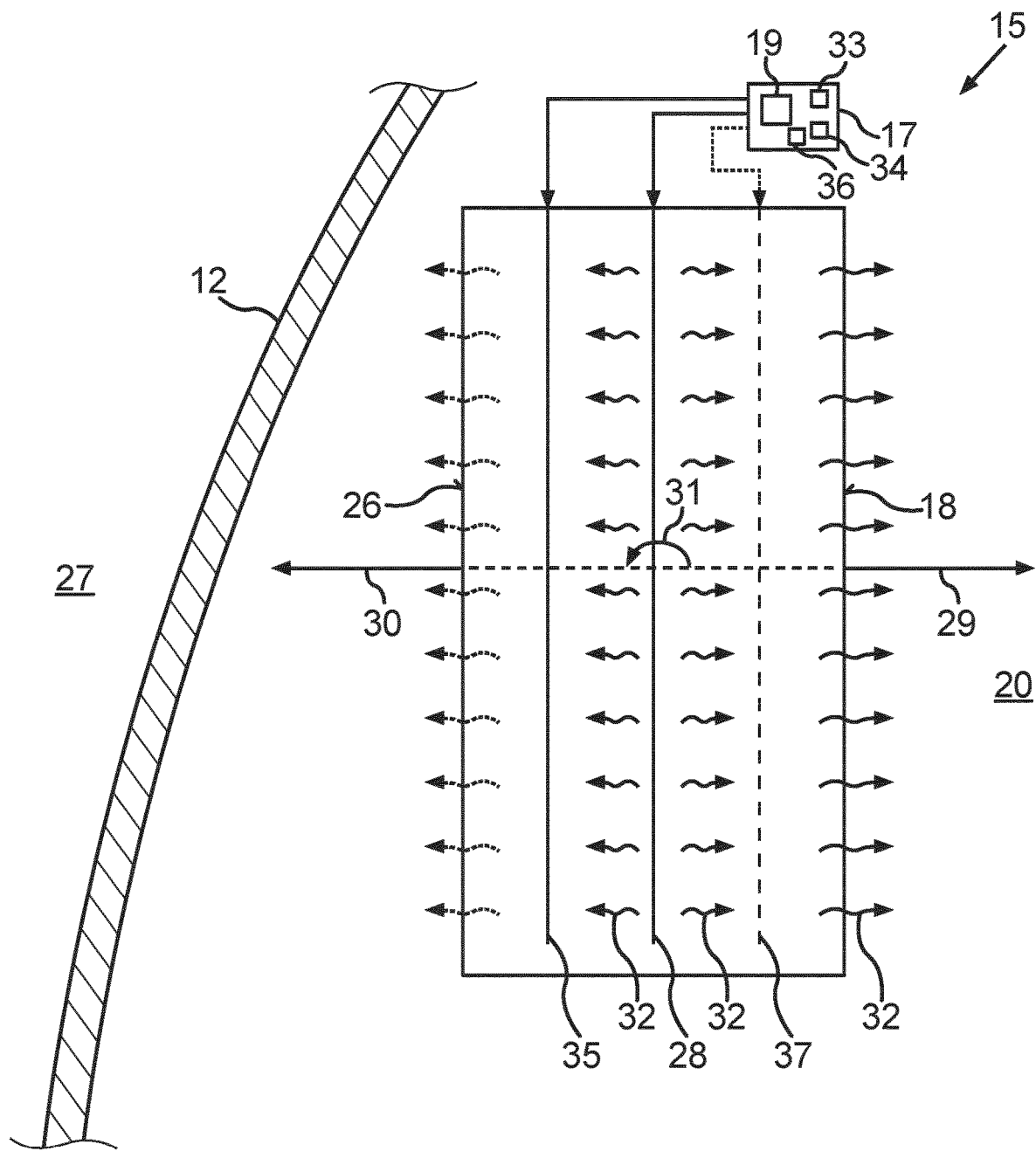
FIG. 2 is a schematic illustration of a cross section of a display device of the motor vehicle described herein, according to examples of the disclosure.

FIG. 2 illustrates how display device 15 with its two display screens 18, 26 may be designed.

The cross section shown in FIG. 2 illustrates how between the two display screens 18, 26 a common pixel matrix 28 may be arranged. Each display screen 18, 26 may have a normal vector 29, 30. The respective normal vector 29, 30 also represents a main direction in which the respective display screen 18, 26 displays the graphical content 21 when activated. Normal vector 29 of the first display screen 18 may face towards or into the passenger cabin 20. Normal vector 30 of the second display screen 26 may face towards the front 27 of the vehicle 10 or through the front window 12. An angle 31 between the two normal vectors 29, 30 may be at least 90 degrees. FIG. 2 shows an angle 31 of 180 degrees. Accordingly, the two display screens 18, 26 may face in two opposite directions as defined by their respective normal vector 29, 30.

The pixel matrix 28 may be a light-emitting pixel matrix which may be based on OLED-technology. Light 32 emitted by pixel matrix 28 may pass through the display screens 18, 26 such that the graphical content 21 may be seen on both screens 18, 26. Single pixel elements of pixel matrix 28 may be controlled by control unit 17 in a way as is known. For each pixel element, a color and/or brightness may be set by control unit 17 in dependence on or as a function of the image data 19.

Control unit 17 may include at least two display modes 33, 34. In the first display mode 33, the graphical content 21 may only be displayed towards one direction, i.e. only by one display screen, for example the first display screen 18. The other display screen, for example the second display screen 26, is deactivated in the first display mode 33. To this end, a switchable layer 35 may be arranged between pixel matrix 28 and the display screen that is to be deactivated, for example the second display screen 26. In the first display mode 33, the switchable layer 35 may be switched into a light-blocking mode by the control unit 17. Light 32 emitted by the pixel matrix 28 into the direction of the second display screen 26 may then be blocked by the switchable layer 35.

In the second display mode 34, the graphical content 21 may be displayed on both display screens 18, 26. Control unit 17 may switch switchable layer 35 into a transparent mode or light-passing mode for the second display mode 34.

In order to provide a third display mode 36, a second switchable layer 37 may be provided between the pixel matrix 28 and the other display screen, for example the first display screen 18. In the third display mode 36, graphical content 21 displayed on the second display screen 26 may therefore be blocked or may not be displayed on the first display screen 18, i.e. the display screen 18 may be deactivated in the third display mode 36. Alternatively, display mode 36 may include that both display screens 18, 26 are deactivated.

Figure 3:
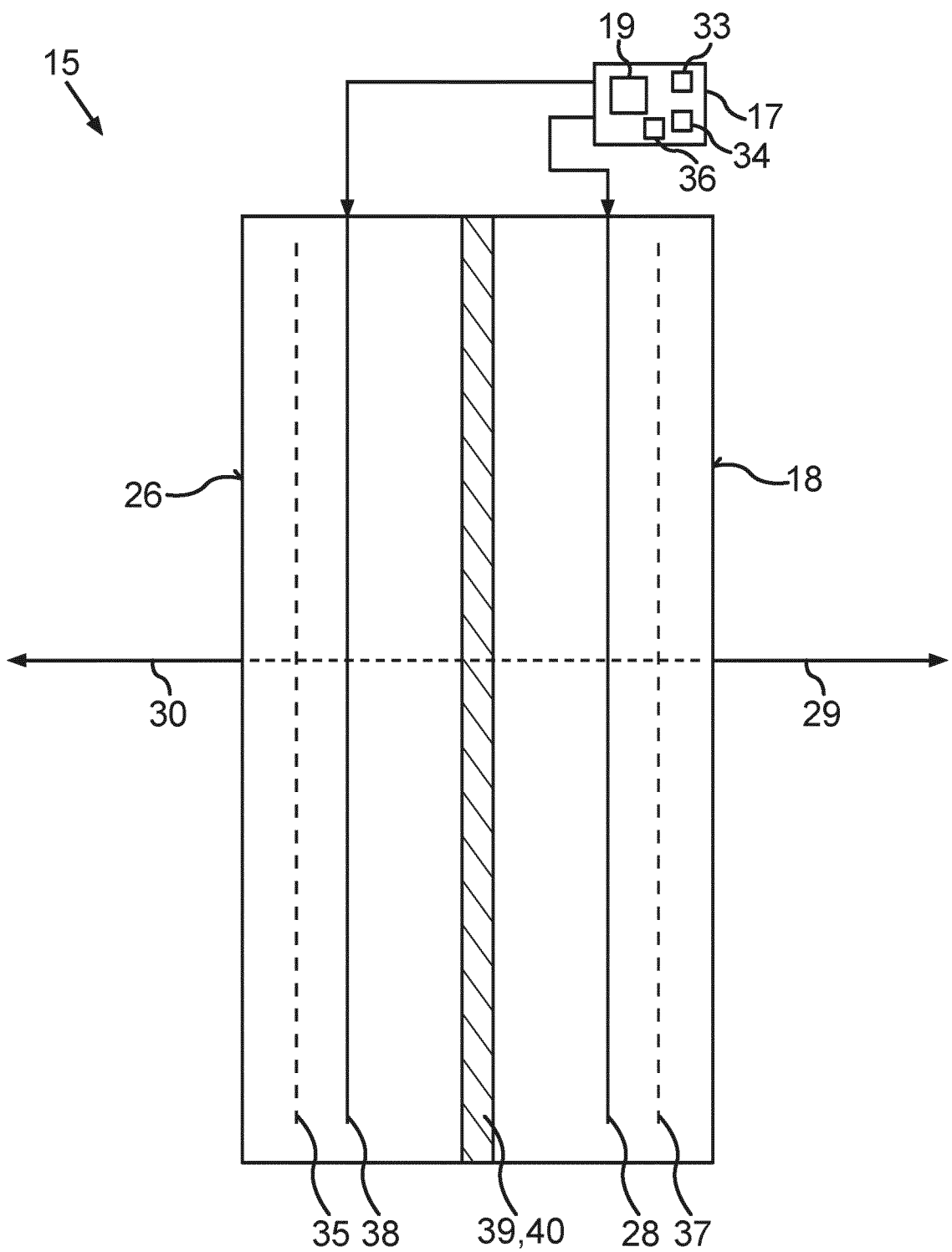
FIG. 3 is a schematic illustration of a cross section of a different embodiment of the display device described herein, according to examples of the disclosure.

FIG. 3 shows an alternative embodiment of the display device 15. In this embodiment, in addition to the pixel matrix 28, a second display matrix 38 may be provided such that for each display screen 18, 26 a separate or dedicated pixel matrix 28, 38 is provided. Between the two pixel matrixes 28, 38, a light-blocking or light-tight material 39 or a common light source 40 may be arranged. If a light-tight material 39 is provided, both pixel matrixes 28, 29 may be operated independently either as OLED or as LCD with separate own light sources. As a light-light material, a polymer or a metal may be provided. If pixel matrixes 28, 38 are based on LCD-technology, the common light source 40 may be used for both pixel matrixes 28, 38 for providing white light as is needed for operating LCDs.

FIG. 3 also shows possible positions for the switchable layer 35 and/or the switchable layer 37, if either one or both shall be provided.

The embodiment shown is based on the concept of a rear mirror based on an electronic display (electronic rear mirror). The display screen 18 in connection with a camera facing rearwards of vehicle 10 may be a replacement for a rear mirror that is based on reflecting light.

The image content or graphical content displayed on the display screen 18 of an electronic rear mirror 16 may only be seen from inside the car, i.e. from the passenger cabin 20.

In the case of display device 15, the rear mirror 16 of vehicle 10 includes display screens 18 and 26 such that the image content 21 may be displayed in the passenger cabin 20 and towards the front 27 of vehicle 10.

In a first display mode, the display device 15 may present the image content 21 only in passenger cabin 20 as is known from a common electronic rear mirror. In the second display mode, the image content can also be seen from outside the vehicle 10. It can be seen through the front window 12.

That is, the display device can be switched between at least two display modes, wherein, in the first display mode, the graphical content 21 can only be seen from inside vehicle 10 (or through other windows from outside), wherein, in the second display mode, the graphical content 21 may be seen from two opposite directions from inside and from outside vehicle 10.

In the first display mode, when the graphical content is only displayed on the display screen 18 facing towards the passenger cabin 20, the camera image data 22 may be displayed. Additional information may also be displayed, e.g. current time, driving direction, warning when a parking maneuver is performed. The first display mode is especially useful when a driver is driving vehicle 10 (in contrast to an autopilot).

In the second display mode, when the graphical content 21 is displayed on both display screens 18, 20 and may thus be seen through the front window 12, information can be displayed regarding a person outside vehicle 10. In the case that vehicle 10 is standing still or is parking, what can be displayed includes for example: the current state of charge of a battery of vehicle 10, the state of the central locking system, a greeting message for an approaching person, e.g. a driver which is recognized by the radio signal of a wireless key, information for car sharing or for car renting or for a taxi/Uber®, and the like.

When the vehicle is driven by an autopilot (autonomous driving and/or stopping), the following can be displayed, for example: a detection signal for a pedestrian, e.g. at a crosswalk, a sign for another vehicle or in general another road user or traffic participant, a current state of a driver assistant system (e.g., activity of autopilot or manual driving mode).

The display device may also be designed in such a way that only parts of the display screen 18 and/or display screen 26 may be switched between the display modes. In other words, only a part of the pixel matrix may be visible through the second display screen 26.

It is also possible to provide a third display mode which includes that the graphical content 21 is only visible on the second display screen 26.

As an electronic rear mirror 16 is arranged in a central position inside the car, it can thus be used advantageously for communicating or displaying graphical content both inside passenger cabin 20 and to the outside of the vehicle 10.

The pixel matrix may be based on OLED-technology or in general on the basis of a transparent display. The switchable layer may be a sheet or foil, e.g. based on liquid crystal glass or SPD or an electrochromic material. In the light-blocking mode, the switchable layer is non-transparent or opaque. In the transparent mode, light may pass through the switchable layer.

The control unit may control therefore the direction in which the graphical content is visible and the graphical content may be changed or set on the basis of image data.

In another embodiment, two pixel matrixes may be provided, one for each display screen.

Overall, the example shows how a double-sided virtual rear mirror is provided by the display device described herein.

A description has been provided with reference to various examples, but it will be understood that variations and modifications can be effected within the spirit and scope of the claims which may include the phrase "at least one of A, B, and C" as an alternative expression that means one or more of A, B, and C may be used, contrary to the holding in Superguide v. DIRECTV, 358 F3d 870, 69 USPQ2d 1865 (Fed. Cir. 2004). As an example, the scope of the expression "at least one of A, B, and C" is intended to include: (1) at least one of A, (2) at least one of B, (3) at least one of C, (4) at least one of A and at least one of B, (5) at least one of A and at least one of C, (6) at least one of B and at least one of C, and (7) at least one of A, at least one of B, and at least one of C.

The invention claimed is:

1. A display device for displaying a pixel-based graphical content, comprising:
   a first display screen which faces in a first direction;
   a first pixel matrix configured to emit light through the first display screen;
   a second display screen which faces in a second direction, different from the first direction;
   a second pixel matrix configured to emit light through the second display screen;
   a light-tight material disposed between the first pixel matrix and the second pixel matrix so that the first pixel matrix and the second pixel matrix are independently operable; and
   a controller configured to:
      control the first pixel matrix to emit light which passes through the first display screen and passes into surroundings of the display device in the first direction so that graphical content is displayed on the first display screen, based on image data that define the graphical content,
      control the second pixel matrix to emit light which passes through the second display screen and passes into surroundings of the display device in the second direction so that graphical content is displayed on the second display screen, based on image data that define the graphical content, and
      operate in a plurality of display modes including:
         a first display mode in which the graphical content as defined by the image data is only displayed on one of the first display screen and the second display screen and the other one of the first display screen and the second display screen is deactivated, and
         a second display mode in which identical graphical content is displayed on both the first display screen and the second display screen.

2. The display device according to claim 1, further comprising:
   a switchable layer, disposed between one of the first pixel matrix and the first display screen, and the second pixel matrix and the second display screen,
   wherein the controller is configured to switch the switchable layer into a light-blocking mode to deactivate one of the first display screen and the second display screen.

3. The display device according to claim 2, wherein the switchable layer is based on at least one of a liquid crystal glass, an electrochromic element, and a suspended particle device.

4. The display device according to claim 2, further comprising a second switchable layer disposed between the other one of the first pixel matrix and the first display screen, and the second pixel matrix and the second display screen, wherein the controller is configured to operate in a third display mode in which the second switchable layer is switched into the light-blocking mode to deactivate the other one of the first pixel matrix and the first display screen, and the second pixel matrix and the second display screen.

5. The display device according to claim 1, wherein the controller is not configured with a display mode for displaying different graphical content based on different image data on the first display screen and second display screen at a same time.

6. The display device according to claim 1, wherein
the display device is configured as an electronic rear mirror for a motor vehicle, and
the controller is configured to receive camera image data from a rear view camera of the motor vehicle as the image data at least in the first display mode.

7. A motor vehicle, comprising:
a passenger cabin; and
a display device configured to display pixel-based graphical content, the display device including:
  a first display screen which faces in a first direction,
  a first pixel matrix configured to emit light through the first display screen,
  a second display screen which faces in a second direction, different from the first direction,
  a second pixel matrix configured to emit light through the second display screen,
  a light-tight material disposed between the first pixel matrix and the second pixel matrix so that the first pixel matrix and the second pixel matrix are independently operable, and
  a controller configured to:
    control the first pixel matrix to emit light which passes through the first display screen and passes into surroundings of the display device in the first direction so that graphical content is displayed on the first display screen, based on image data that define the graphical content,
    control the second pixel matrix to emit light which passes through the second display screen and passes into surroundings of the display device in the second direction so that graphical content is displayed on the second display screen, based on image data that define the graphical content, and
    operate in a plurality of display modes including:
      a first display mode in which the graphical content as defined by the image data is only displayed on one of the first display screen and the second display screen and the other one of the first display screen and the second display screen is deactivated, and
      a second display mode in which identical graphical content is displayed on both the first display screen and the second display screen.

8. The motor vehicle according to claim 7, wherein
the first display screen faces towards the passenger cabin of the motor vehicle, and
the second display screen faces towards a front window of the motor vehicle or is constituted by the front window of the motor vehicle.

9. The motor vehicle according to claim 7, wherein
the display device further includes a switchable layer, disposed between one of the first pixel matrix and the first display screen, and the second pixel matrix and the second display screen, and
the controller is configured to switch the switchable layer into a light-blocking mode to deactivate one of the first display screen and the second display screen.

10. The motor vehicle according to claim 9, wherein the switchable layer is based on at least one of a liquid crystal glass, an electrochromic element, and a suspended particle device.

11. The motor vehicle according to claim 9, wherein
the display device further includes a second switchable layer disposed between the other one of the first pixel matrix and the first display screen, and the second pixel matrix and the second display screen, and
the controller is configured to operate in a third display mode in which the second switchable layer is switched into the light-blocking mode to deactivate the other one of the first pixel matrix and the first display screen, and the second pixel matrix and the second display screen.

12. The motor vehicle according to claim 7, wherein the controller is not configured with a display mode for displaying different graphical content based on different image data on the first display screen and the second display screen at a same time.

13. The motor vehicle according to claim 7, further comprising:
a rear view camera directed toward a rear of the motor vehicle and configured to transmit camera image data of an image captured by the rear view camera to the controller; and
an electronic rear mirror to display the camera image data, wherein the electronic rear mirror constitutes the display device, and the first display screen faces toward the passenger cabin.

14. The motor vehicle according to claim 13, wherein:
in the first display mode, graphical content as defined by the camera image data is only displayed on the first display screen and the second display screen is deactivated, and
in the second display mode, graphical content as defined by the camera image data is displayed on the first display screen and is viewable from the passenger cabin and the graphical content as defined by the camera image data is displayed on the second display screen and is viewable from outside of the motor vehicle through a front window of the motor vehicle.

* * * * *